United States Patent
Hein et al.

(10) Patent No.: US 9,662,987 B2
(45) Date of Patent: May 30, 2017

(54) METHOD AND APPARATUS FOR DETECTING THE EXISTENCE OF A SAFETY GROUND

(75) Inventors: David A. Hein, Sterling Heights, MI (US); Ahmad Khalifeh, Dearborn, MI (US)

(73) Assignee: LEAR CORPORATION, Southfield, MI (US)

( * ) Notice: Subject to any disclaimer, the term of this patent is extended or adjusted under 35 U.S.C. 154(b) by 1187 days.

(21) Appl. No.: 13/342,294

(22) Filed: Jan. 3, 2012

(65) Prior Publication Data

US 2012/0212235 A1 Aug. 23, 2012

Related U.S. Application Data

(60) Provisional application No. 61/444,335, filed on Feb. 18, 2011.

(51) Int. Cl.

| | | |
|---|---|---|
| *G01R 31/00* | (2006.01) | |
| *B60L 11/18* | (2006.01) | |
| *G01R 31/02* | (2006.01) | |
| *H02H 11/00* | (2006.01) | |
| *G01R 31/42* | (2006.01) | |
| *H02H 5/10* | (2006.01) | |

(52) U.S. Cl.
CPC ........ *B60L 11/1816* (2013.01); *G01R 31/026* (2013.01); *H02H 11/001* (2013.01); *G01R 31/42* (2013.01); *H02H 5/105* (2013.01); *Y02T 10/7005* (2013.01); *Y02T 10/7072* (2013.01); *Y02T 90/14* (2013.01)

(58) Field of Classification Search
CPC .................. G01R 27/18; B60L 3/04

USPC ........ 324/503, 500, 508, 509, 510, 512, 522
See application file for complete search history.

(56) References Cited

U.S. PATENT DOCUMENTS 3,825,915 A * 7/1974 Dow ............................. 340/649
3,934,176 A * 1/1976 Vasudevan ........... H02H 11/001
340/650

(Continued)

FOREIGN PATENT DOCUMENTS

| CN | 2258620 Y | 7/1997 |
|----|-----------|--------|
| CN | 101871963 A | 10/2010 |
| JP | 2003250201 A1 | 9/2003 |

OTHER PUBLICATIONS

Chinese Office Action for corresponding Application No. 201210035372.9, mailed Dec. 19, 2013, 11 pages.

*Primary Examiner* — Giovanni Astacio-Oquendo
(74) *Attorney, Agent, or Firm* — Brooks Kushman P.C.

(57) ABSTRACT

An apparatus including a test device for assessing the quality of a safety ground is provided. The test device is configured to receive an energy signal from a power source for charging a vehicle and to generate a first output signal in response to the first energy signal. The test device is further configured to measure a characteristic of the first output signal and to provide a test signal. The test device is further configured to generate a second output signal in response to providing the test signal and to measure a characteristic of the second output signal. The test device is further configured to assess the quality of a safety ground in at least one of the power source and the vehicle based on a difference between the characteristic of the first output signal and the characteristic of the second output signal.

5 Claims, 2 Drawing Sheets

(56) References Cited

U.S. PATENT DOCUMENTS

| | | | | |
|---|---|---|---|---|
| 3,995,200 A * | 11/1976 | Stolarczyk | ............ | H02H 11/001 361/113 |
| 5,309,499 A | 5/1994 | Webber | | |
| 5,606,480 A * | 2/1997 | Nevo | ................... | G01R 31/026 361/45 |
| 5,666,255 A * | 9/1997 | Muelleman | ................... | 361/111 |
| 5,754,114 A | 5/1998 | Gnadt | | |
| 5,809,109 A | 9/1998 | Moyal et al. | | |
| 6,016,058 A | 1/2000 | Sussman et al. | | |
| 6,388,451 B1 * | 5/2002 | Burba et al. | ................... | 324/522 |
| 6,590,188 B2 | 7/2003 | Cline et al. | | |
| 6,617,841 B2 | 9/2003 | Thao | | |
| 6,678,132 B1 * | 1/2004 | Carruthers | ............ | B60L 3/0023 361/42 |
| 6,867,596 B1 * | 3/2005 | Mizuno | ................ | G01R 31/021 324/521 |
| 6,873,158 B2 | 3/2005 | Macbeth | | |
| 6,980,005 B2 | 12/2005 | Finlay, Sr. et al. | | |
| 7,042,687 B2 | 5/2006 | Radosavljevic et al. | | |
| 7,253,629 B1 | 8/2007 | Richards et al. | | |
| 7,253,634 B1 | 8/2007 | Kasztenny et al. | | |
| 7,375,938 B1 | 5/2008 | Radosavljevic et al. | | |
| 7,843,197 B2 | 11/2010 | Finlay, Sr. et al. | | |
| 8,466,700 B2 * | 6/2013 | Motz | ........................ | G01D 3/08 324/750.07 |
| 2004/0145842 A1 * | 7/2004 | Rice | ........................ | H02H 3/28 361/42 |
| 2004/0229586 A1 * | 11/2004 | Oshima | ................ | H03G 3/3068 455/240.1 |
| 2007/0103165 A1 * | 5/2007 | Gaston et al. | ................ | 324/510 |
| 2007/0116997 A1 * | 5/2007 | Raiser | ............................ | 429/23 |
| 2007/0216484 A1 * | 9/2007 | Redoute | ................. | G05F 3/262 330/257 |
| 2007/0229090 A1 | 10/2007 | Kumar | | |
| 2009/0116662 A1 * | 5/2009 | Wu | ........................ | H04R 3/007 381/94.2 |
| 2010/0295508 A1 * | 11/2010 | Mueller | .............. | B60L 11/1816 320/109 |
| 2011/0006842 A1 * | 1/2011 | Koren | ................... | H03F 1/3247 330/185 |
| 2011/0298466 A1 * | 12/2011 | Hein et al. | ..................... | 324/508 |
| 2012/0161797 A1 * | 6/2012 | Hein | ..................... | G01R 31/42 324/705 |
| 2012/0249067 A1 * | 10/2012 | Hein | ........................ | B60L 3/04 320/109 |
| 2013/0147419 A1 * | 6/2013 | Sakai | ..................... | H02M 1/12 318/722 |

* cited by examiner

METHOD AND APPARATUS FOR DETECTING THE EXISTENCE OF A SAFETY GROUND

CROSS-REFERENCE TO RELATED APPLICATIONS

This application claims the benefit of U.S. provisional Application No. 61/444,335 filed on Feb. 18, 2011, the disclosure of which is hereby incorporated by reference in its entirety.

TECHNICAL FIELD

Embodiments set forth herein generally relate to a method and apparatus for assessing the quality of a safety ground.

BACKGROUND

It is known to provide a ground detection device that detects continuity of a safety ground. One example for detecting the continuity of a safety ground is set forth below.

U.S. Pat. No. 5,754,114 to Gnadt provides a ground detection apparatus that automatically detects continuity of a safety ground of a piece of equipment. The ground detection apparatus includes test relay circuitry for determining if a ground connection is open. Comparison logic circuitry is used to generate a fault signal if the ground connection is open and to prevent the electrical equipment from being energized. Delay circuitry is used to stabilize input voltage measurements, and to test the lines for a desired time period. Latching circuitry is used to latch the fault condition, and to ensure that all delays have elapsed and no fault condition exists before the electrical equipment is energized. Optionally, the latching circuitry may be used to prevent latching in a "brownout" condition. If the equipment safety ground is not present, power is not supplied to the equipment. This prevents possible shock to a user caused by ungrounded equipment. The ground detection apparatus also provides an audible alert, and may also provide a light indication, that indicates that a ground connection is not present.

SUMMARY

An apparatus including a test device for assessing the quality of a safety ground is provided. The test device is configured to receive an energy signal from a power source for charging a vehicle and to generate a first output signal in response to the first energy signal. The test device is further configured to measure a characteristic of the first output signal and to provide a test signal. The test device is further configured to generate a second output signal in response to providing the test signal and to measure a characteristic of the second output signal. The test device is further configured to assess the quality of a safety ground in at least one of the power source and the vehicle based on a difference between the characteristic of the first output signal and the characteristic of the second output signal.

A method for assessing the quality of a safety ground is provided. The method comprises receiving an energy signal from a power source for charging a vehicle and generating a first output signal in response to the energy signal. The method further comprises measuring a characteristic of the first output signal and providing a test signal. The method further comprises generating a second output signal in response to providing the test signal and measuring a characteristic of the second output signal. The method further comprises assessing the quality of a safety ground in at least one of the power source and the vehicle based on a difference between the characteristic of the first output signal and the characteristic of the second output signal.

An apparatus including a test device for assessing the quality of a safety ground is provided. The test device configured to: receive an energy signal from a power source for charging a vehicle and to generate a first amplified filtered output in response to the energy signal. The test device is further configured to measure a voltage of the first amplified filtered output and to provide a test signal. The test device is further configured to generate a second amplified filtered output in response to providing the test signal and to measure a voltage of the second amplified filtered output. The test device is further configured to assess the quality of a safety ground in at least one of the power source and the vehicle based on the voltage of the first amplified filtered output, the voltage of the second amplified filtered output, and a threshold.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

Figure 1:
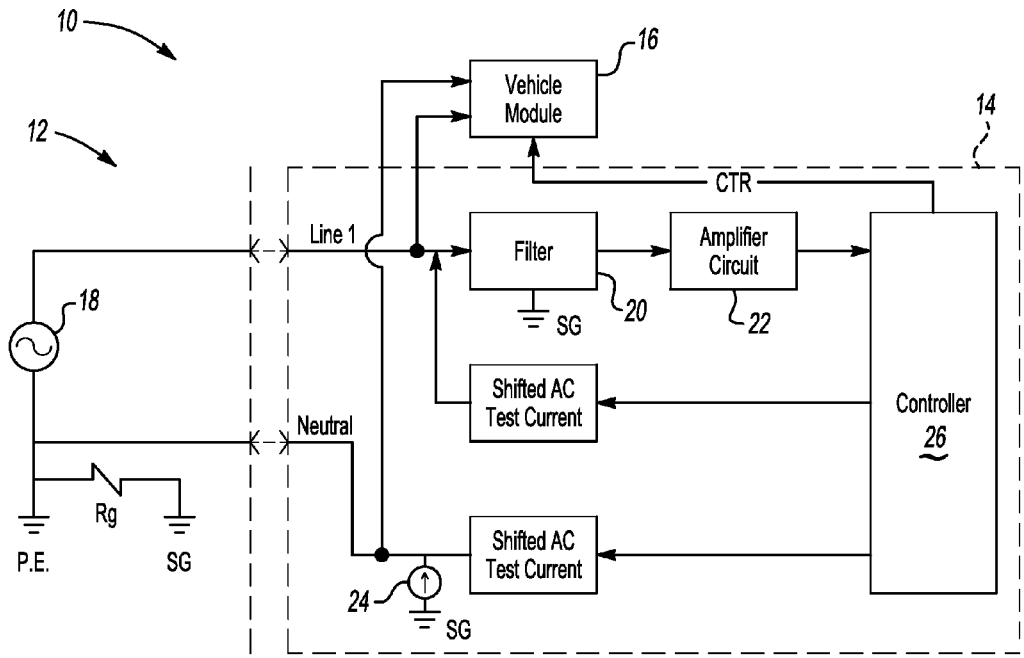
FIG. 1 depicts an apparatus for detecting the existence of a safety ground in accordance to one embodiment of the present invention.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In general, for a proper ground connection, a corresponding ground resistance $R_g$ should be less than 10 Ohms. One conventional approach may include a device that detects a level of ground that is as close to $R_g$ while using a minimum test current. Since the test current may be less than a leakage current upstream (i.e., in a vehicle) from a ground fault interrupt (GFI) (in a power station (e.g., home, building, outside charging station, etc.)), such a test current should be substantially less than the trip current of the GFI. The trip current of the GFI may be 4 to 6 mA. In this case, the test current should be substantially less than the trip current of the GFI. As such, the test current as utilized in connection with the device may be less than 1 mA.

It has been discovered that galvanic voltage may have a significant effect on the ability to detect ground resistance when using a low test current. Galvanic voltage ($V_{galvanic}$) is a voltage that is generally formed by dissimilar materials and may be in a range of + or −700 millivolts depending on the types of materials that are in contact with one another. $V_{galvanic}$ may appear as an offset or additive voltage to any measurements that are made to test the ground continuity.

The impact of $V_{galvanic}$ on the ability to detect ground resistance may be shown by the following equation:

$$V_{test} = V_{galvanic} + I_{test} * R_{ground} \quad \text{(Eq. 1)}$$

where $V_{test}$ is the voltage the test device may receive when attempting to detect $R_{ground}$.

Since a good ground must be detected in the presence of $V_{galvanic}$ of + or −700 mV, $V_{test}$ should be approximately 20% higher than the maximum allowed $V_{galvanic}$ of +700 mV (i.e., $V_{test}$=840 mV). For the overall highest degree of accuracy in terms of where $R_{ground}$ can be detected, $V_{test}$=840 mV, $I_{test}$=1 mA, and the minimum possible value of $V_{galvanic}$ is −700 mV. By inserting such values into the Eq. 1, $R_{ground}$ is found to be equal to 1440 Ohms.

Detection of $R_{ground}$ at this level may be difficult to detect and may not be sufficient to guarantee that a proper ground exists. Other environmental factors such as rain, water, and humidity may simulate a ground resistance at this level if a valid ground does not exist. Therefore, using the above conventional approach for detecting a ground resistance may either prevent the product from being used in areas where there is a good ground but have a high galvanic voltage, or allow battery charging when a proper ground may not exist.

One or more aspects disclosed herein may improve the detection quality of a good/bad ground connection for a hybrid or electric vehicle while the vehicle is being charged. The charging operation may be tripped to prevent the charging of the vehicle during the presence of a bad ground. A test device as disclosed herein may measure and record a first amplified filtered output from the output of a filter and an amplifier. The test device may then apply a test current after recording the first amplified filtered output. The test device may then measure and record a second amplified filtered output from the output of the filter and the amplifier. A comparison is made between a threshold and a voltage difference between the first amplified filtered output and the second amplified filtered output. If the voltage difference is less than the threshold, then the test device may determine that the ground connection for the vehicle is good. If the voltage difference is greater than the threshold, then the test device may determine that the ground connection for the vehicle is bad and disable the vehicle charging operation. By calculating the voltage difference in the manner set forth herein, a determination of $R_{ground}$ at such a low level may be avoided.

The embodiments set forth below may provide for a method of detecting the presence of a safety ground connection that may have a high immunity to different home wiring configurations and may provide the ability to discriminate a marginal ground from a good ground. The embodiments may also take into account galvanic voltages when the first and the second amplified filtered outputs are measured and recorded.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, RAM, ROM, EPROM, EEPROM, or other suitable variants thereof) and software which co-act with one another to perform operation(s) disclosed herein.

FIG. 1 depicts an apparatus 10 for detecting the existence of a safety ground in accordance to one embodiment of the present disclosure. The apparatus 10 comprises a power station 12, a test device 14, and a vehicle module 16. The power station 12 includes a power source 18 positioned about an establishment that provides AC power therefrom. In one example, the power station 12 may include an outlet (not shown) that is operably coupled to a power source 18 for enabling the transmission of AC energy. The test device 14 may be positioned in one of a charge station, a portable charge cord set, and the vehicle. The vehicle module 16 may also be positioned in one of a charge station, a portable charge cord set, and the vehicle. The vehicle may include one or more batteries (not shown) for receiving the AC energy such that a battery charger or other suitable device converts the AC energy into DC energy to charge the one or more batteries (not shown).

The power station 12 includes a protective earth ground (PEG) and a safety ground (SG) for grounding the power source 18. The PEG is generally known as the natural ground path to the earth or terrain. In general, the test device 14 is configured to detect an overall quality of a ground connection (e.g., of the SG) while the vehicle is being charged by the power station 12. The vehicle module 16 may trip and prevent the charging of the vehicle when the presence of a bad ground is detected. A resistance (as represented by $R_g$) may be indicative of whether a good or bad ground is present. A high ground resistance may be indicative of a bad ground connection (or open ground) for SG. A low ground resistance may be indicative of good ground for SG. In one example, a good ground connection may correspond to $R_g$ having a resistance of less than 100 Ohms. A bad ground connection may correspond to $R_g$ having a resistance of greater than 100 Ohms.

The test device 14 generally includes a filter 20, an amplifier circuit 22, a current source 24, and a controller 26. As depicted, an input LINE 1 (e.g., hot line from power station 12) is fed into the vehicle module 16 and the filter 20. The test device 14 may perform the safety ground test in the following manner. The AC energy on the input LINE 1 is presented to the filter 20. A first output (e.g., a first average DC energy value) from the filter 20 is provided to the amplifier circuit 22. The amplifier circuit 22 amplifies the output from the filter 20 and generates a first amplified filtered output. The controller 26 receives the first amplified filtered output and measures the voltage therein. The controller 26 measures and stores the voltage from the first amplified filtered output.

The controller 26 applies a shifted AC test current on the LINE 1 and on Neutral. By applying the shifted AC test current on the LINE 1 and Neutral, such a condition may allow for easy polarity reversal. For example, the controller 26 includes a current limiting diode (not shown) to generate the shifted AC test current thereby limiting the passage of current on a negative half of the AC cycle. The controller 26 controls the current source 24 to inject additional current onto the LINE 1 and Neutral. The additional current added onto LINE 1 and Neutral increases the signal to noise ratio. The shifted AC test current is fed to the filter 20. The filter 20 generates a second output (e.g., a second average DC energy value) based off of the shifted AC test current. The amplifier circuit 22 amplifies the second output and generates a second amplified filtered output. The controller 26 measures and stores the voltage from the second amplified filtered output.

The controller 26 compares the first amplified filtered output to the second amplified filtered output. If the difference between the first amplified filtered output and the second amplified filtered output is below a threshold, then the controller 26 determines that a good ground connection is present (e.g., the resistance of $R_g$ is low). If the difference between the first amplified filtered output and the second amplified filtered output is above the threshold (e.g., 300 V), then the controller 26 determines that a bad connection is present (e.g., the resistance of $R_g$ is high). For example, if the voltage difference between the first amplified filtered output and the second amplified filtered output is less than the 300 mv, then the controller 26 determines that a good ground condition (e.g., safety ground) is present. In the event the controller 26 determines that the voltage difference between the first amplified filtered output and the second amplified filtered output is above the threshold, then the controller 26 controls the vehicle module 16 to disable the transfer of AC energy to the vehicle via a signal CTR.

Figure 2:
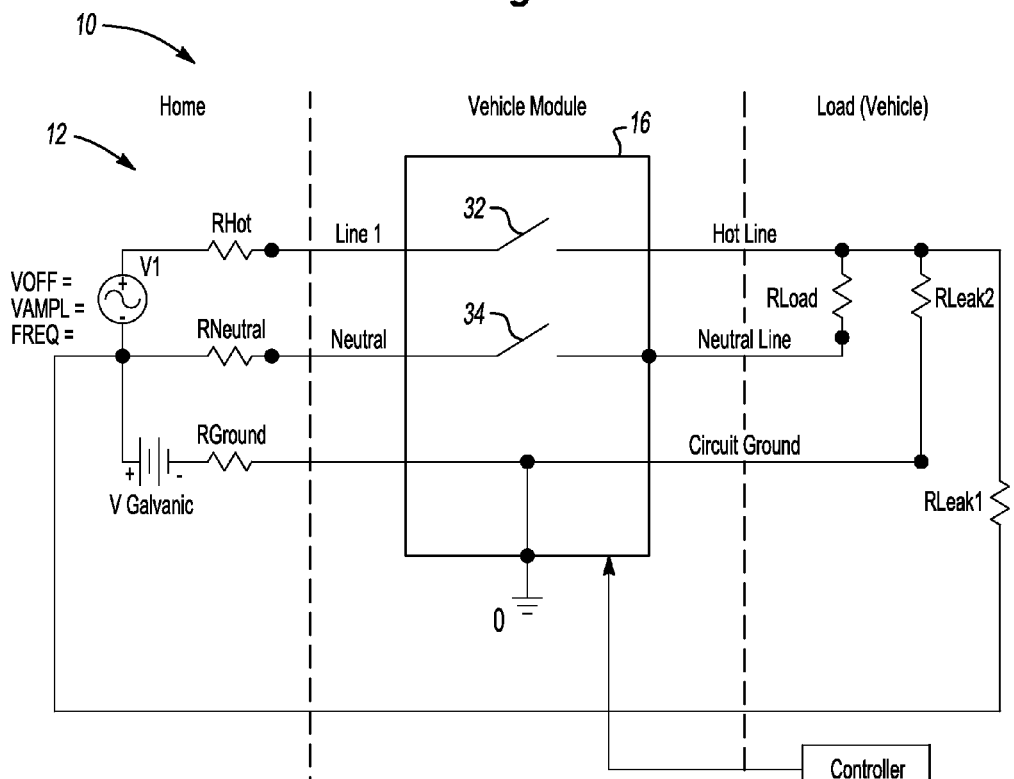
FIG. 2 depicts a more detailed diagram of the vehicle module in accordance to one embodiment of the present invention.

FIG. 2 depicts a more detailed diagram of the vehicle module 16 in accordance to one embodiment of the present invention. The vehicle module 16 may include a first switch 32 being coupled to LINE 1 and a second switch 34 being coupled to NEUTRAL. As shown, the controller 26 controls the vehicle module 16 to open the switches 32, 34 included therein to prevent the flow of AC energy from the power station 12 to the vehicle module 16 in response to determining that the difference between the first and the second amplified filtered outputs is greater than the threshold.

Figure 3:
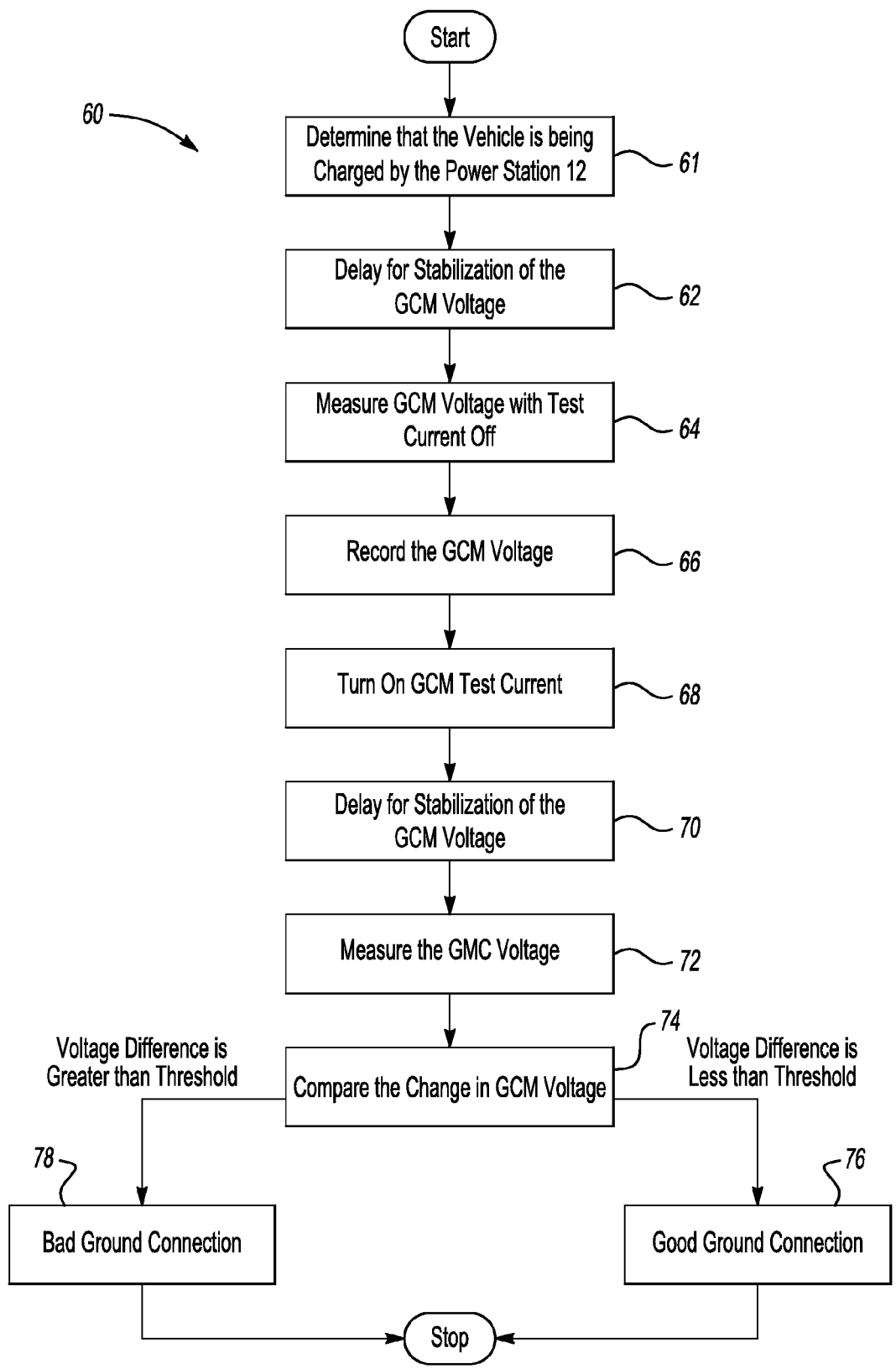
FIG. 3 depicts a method for detecting the existence of a safety ground in accordance to one embodiment of the present invention.

FIG. 3 depicts a method 60 for detecting the existence of a safety ground in accordance to one embodiment of the present invention. It is recognized that one or more operations as noted in connection with the method 60 may be performed in any sequence and that such operations are not intended to be executed solely in the manner shown.

In operation 61, the controller 26 determines that the vehicle is undergoing a charging operation in response to receiving the first amplified filtered output.

In operation 62, the controller 26 may incorporate a first delay such that the first amplified filtered output received from the filter 20 is allowed to stabilize. The controller 26 may incorporate the first delay and wait for values on the first amplified filtered output to be within an acceptable range prior to taking measurements thereof. In one example, the first delay may be 3 seconds In operation 64, the controller 26 measures the voltage from the first amplified filtered output with the test current off (e.g., controller 26 does not apply shifted AC test current) after the delay has expired.

In operation 66, the controller 26 stores the voltage from the first amplified filtered output with the test current off.

In operation 68, the controller 26 applies the shifted AC test current on Line 1 and Neutral.

In operation 70, the controller 26 triggers a second delay in response to applying the shifted AC test current. The controller 26 incorporates the second delay such that the second amplified filtered output received from the filter 20 is given the opportunity to stabilize. The controller 26 waits for values on the second amplified filtered output to be within an acceptable range prior to taking measurements thereof.

In operation 72, the controller 26 measures and stores the voltage from the second amplified filtered output while the test current is being applied.

In operation 74, the controller 26 compares a voltage difference between the first and the second amplified filtered output to the threshold. If the voltage difference is less than the threshold, then method 60 moves to operation 76. If the voltage difference is greater than the threshold, then the method 60 moves to operation 78. The threshold may be set to 300 mV or other suitable value. In general, the lower the difference (or the threshold), the more accurate the system 10 may be in determining the adequacy of the ground connection. A greater difference value, if used, may make readings or measurements more immune to noise.

In operation 76, the controller 26 determines that a good or adequate ground connection has been established. The controller 26 controls the vehicle module 16 to enable energy transfer to the vehicle.

In operation 78, the controller 26 determines that a bad ground connection has been established. The controller 26 controls the vehicle module 16 to disable energy transfer to the vehicle.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus for assessing a quality of a safety ground, the apparatus comprising:
   a test device including a filter and an amplifier circuit and being configured to:
   receive an energy signal from a power source for charging a vehicle;
   generate a first filtered output with the filter in response to the energy signal;
   generate a first amplified filtered output with the amplifier circuit in response to the first filtered output;
   measure a voltage of the first amplified filtered output;
   provide a test signal after measuring the voltage of the first amplified filtered output;
   generate a second filtered output with the filter in response to the test signal;
   generate a second amplified filtered output with the amplifier circuit in response to the second filtered output;
   measure a voltage of the second amplified filtered output; and
   assess the quality of a safety ground in at least one of the power source and the vehicle based on the voltage of the first amplified filtered output, the voltage of the second amplified filtered output, and a threshold.

2. The apparatus of claim 1 wherein the test device is further configured to compare a difference between the voltage of the first amplified filtered output and the voltage of the second amplified filtered output to the threshold to assess the quality of the safety ground.

3. The apparatus of claim 2 wherein the test device is further configured to determine that the safety ground is faulty if the difference between the voltage of the first amplified filtered output and the voltage of the second amplified filtered output is greater than the threshold.

4. The apparatus of claim 2 wherein the test device is further configured to determine that the safety ground is acceptable if the difference between the voltage of the first amplified filtered output and the voltage of the second amplified filtered output is less than the threshold.

5. The apparatus of claim 1 wherein the test signal is an alternating current (AC) test signal.

\* \* \* \* \*